United States Patent [19]
Zheng et al.

[11] Patent Number: 5,748,542
[45] Date of Patent: May 5, 1998

[54] CIRCUIT AND METHOD FOR PROVIDING A SUBSTANTIALLY CONSTANT TIME DELAY OVER A RANGE OF SUPPLY VOLTAGES

[75] Inventors: Hua Zheng; Jeffrey P. Wright, both of Boise, Id.

[73] Assignee: Micron Technology, Inc., Boise, Id.

[21] Appl. No.: 766,745

[22] Filed: Dec. 13, 1996

[51] Int. Cl.⁶ .................................................. G11C 5/14
[52] U.S. Cl. ........................... 365/194; 365/266; 327/261; 327/262
[58] Field of Search ........................ 365/194, 226, 365/149; 327/261, 263, 270, 276, 262

[56] References Cited

U.S. PATENT DOCUMENTS

| | | | |
|---|---|---|---|
| 5,164,621 | 11/1992 | Miyamoto | 327/262 |
| 5,278,460 | 1/1994 | Casper | 307/296.5 |
| 5,317,213 | 5/1994 | Sato et al. | 307/475 |
| 5,361,002 | 11/1994 | Casper | 327/530 |
| 5,418,747 | 5/1995 | Tobita | 365/194 |
| 5,432,665 | 7/1995 | Hopkins | 361/18 |
| 5,461,585 | 10/1995 | Chonan | 365/194 |
| 5,532,969 | 7/1996 | Houghton et al. | 365/226 |
| 5,600,273 | 2/1997 | Hall et al. | 327/261 |
| 5,600,280 | 2/1997 | Zhang | 327/261 |
| 5,610,546 | 3/1997 | Carbou et al. | 327/261 |

FOREIGN PATENT DOCUMENTS 63-316405  6/1990  Japan.

*Primary Examiner*—Tan T. Nguyen
*Attorney, Agent, or Firm*—Seed and Berry LLP

[57] ABSTRACT

A delay circuit provides a substantially constant delay over a range of power-supply voltages. The delay circuit includes an input terminal that receives an input signal, an output terminal that provides an output signal, and a supply terminal that receives a supply voltage. A delay stage is coupled between the input and the output terminals and, when the supply voltage has a predetermined value, generates the output signal a predetermined delay time after it receives the input signal. A control stage is coupled between the supply terminal and the delay stage and regulates the supply current that flows between the supply terminal and the delay stage such that the delay time of the delay stage remains substantially equal to the predetermined delay time as the supply voltage varies from the predetermined value.

23 Claims, 5 Drawing Sheets

CIRCUIT AND METHOD FOR PROVIDING A SUBSTANTIALLY CONSTANT TIME DELAY OVER A RANGE OF SUPPLY VOLTAGES

TECHNICAL FIELD

The present invention relates generally to integrated semiconductor circuits, and more specifically to a circuit and method for providing a substantially constant delay time over a relatively wide range of power-supply voltages.

BACKGROUND OF THE INVENTION

Many of today's integrated circuits require signal delay circuits to provide proper timing of signals both internal and external to the integrated circuits. It is often desired that the delay time introduced by such a delay circuit, i.e., the time by which the delay circuit delays a signal, meet tight tolerance requirements. That is, it is often desired that the delay time lie within a narrow range to insure that an integrated circuit operates properly.

A problem with many existing delay circuits is that their delay times vary significantly as the power-supply voltage (for the integrated circuits containing the delay circuits) changes or shifts from a predetermined or desired voltage. Poor regulation of the desired power-supply voltage is one cause of such shifting.

Furthermore, because its delay time is sensitive to variations in the supply voltage, such a delay circuit prohibits an engineer from using an integrated circuit that incorporates the delay circuit in a system that uses a supply voltage that is different from the desired voltage. For example, popular supply voltages for electronic systems include 5.0V and 3.3V. If a delay circuit is designed to provide a predetermined delay with a 5.0V supply, the integrated circuit containing the delay circuit often cannot be used in a 3.3V system. Of course, one may design a version of the integrated circuit that includes a delay circuit for providing the desired delay with a 3.3V supply voltage. However, designing different versions of an integrated circuit that work with different supply voltages is often time consuming and prohibitively expensive.

FIG. 1 is a schematic diagram of a known delay circuit 10, which provides a delay time that changes as the supply voltage $V_{DD}$ changes. The delay circuit 10 includes two primary delay stages 12a and 12b, an intermediate stage 14, and an output stage 16, which are all serially coupled between an input terminal 17 and an output terminal 19.

In operation, when an input logic signal at the input terminal 17 transitions from a logic 1 to a logic 0, the circuit 10 introduces a falling-edge delay time Dft to the input logic signal composed of the sum of the delay times of the delay stages 12a and 12b. Specifically, the stage 12a introduces a falling-edge delay time Dfa to the input logic signal. As the level of the logic signal reaches and falls below the switching threshold, ie., trip point, of the stage 12a, the transistors 20a and 20b turn off, i.e., become inactive, and the transistors 18a and 18b turn on, i.e., become active. The active transistors 18a and 18b allow a charge current to flow between $V_{DD}$ and the capacitor Ca. The falling-edge delay Dfa is the time it takes for the charge current to charge the capacitor Ca to a voltage that equals the trip point of the next stage 12b. Thus, the values of Ca and the charge current determine the falling-edge delay Dfa, which increases as Ca increases or the charge current decreases, and decreases as Ca decreases or the charge current increases.

When the logic signal generated by the stage 12a transitions from a logic 0 to a logic 1 (in response to the logic-1-to-logic-0 transition of the input signal), the stage 12b introduces a second falling-edge delay Dfb to the input logic signal. Although the stage 12a inverts the input logic signal so as to provide a rising edge to the stage 12b, the delay that the stage 12b introduces to the logic signal from the stage 12a is referenced to the input logic signal, and is thus referred to as a falling-edge delay. Specifically, as the voltage across the capacitor Ca charges to and above the trip point of the delay stage 12b, the transistors 18c and 18d turn off, and the transistors 20c and 20d turn on. The active transistors 20c and 20d allow a discharge current to flow between the capacitor Cb and ground. The falling-edge delay Dfb is the time it takes for the discharge current to discharge the capacitor Cb to a voltage that equals the trip point of the next stage 14. Thus, the values of Cb and the discharge current determine the falling-edge delay Dfb, which increases as Ca increases or the discharge current decreases, and decreases as Ca decreases or the discharge current increases.

The falling-edge delay introduced to the input logic signal by the intermediate stage 14 is typically much less than the falling-edge delays Dfa and Dfb, and thus is typically ignored. As the voltage across the capacitor Cb discharges to and below the trip point of the intermediate stage 14, the transistors 22a and 22b turn on, and the transistors 24a and 24b turn off. The active transistors 22a and 22b allow a charge current to flow between $V_{DD}$ and the parasitic capacitance Cp, which is typically much smaller than Ca or Cb. Thus, the voltage across Cp charges relatively quickly to the trip point of a conventional inverter 26, which provides the falling edge of an output logic signal the delay time Dft after the falling edge of the input logic signal. The delay of the inverter 26 is also typically much less than Dfa and Dfb, and thus is also typically ignored.

It is clear from the above description that the total delay time Dft of the circuit 10 is approximately equal to Dfa+Dfb. Therefore, by adjusting the falling-edge delays Dfa and Dfb of the stages 12a and 12b, respectively, one can set the total falling-edge delay Dft of the circuit 10 to a desired value.

Still referring to FIG. 1, when the input logic signal transitions from a logic 0 to a logic 1, the circuit 10 introduces a total rising-edge delay Drt to the input logic signal. Drt is approximately equal to Dra+Drb, where Dra is the rising-edge delay of the stage 12a, and Drb is the rising edge delay of the stage 12b. In a manner similar to that described above for the falling-edge delay, the transistors 20a and 20b allow a discharge current to flow between Ca and ground, the transistors 18c and 18d allow a charge current to flow between $V_{DD}$ and Cb, the transistors 24a and 24b allow a discharge current to flow between Cp and ground, and the inverter 26 provides the rising edge of the output logic signal the delay time Drt after the rising edge of the input logic signal.

Typically, the delay circuit 10 is designed to provide a predetermined delay time D at a predetermined voltage $V_{DD}$ for both Drt and Dft, i.e., D=Drt=Dft. However, if $V_{DD}$ varies or shifts to another voltage level, then Drt and Dft may become unequal to each other, and may both become unequal to D. Such shifts in Drt and Dft have many causes. For example, the logic 0 of the input logic signal typically is equal to approximately 0 volts, and the logic 1 is typically equal to approximately $V_{DD}$. As $V_{DD}$ shifts, the logic 1 voltage level of the input logic signal shifts, as do the gate-to-source voltages applied to the transistors 18a–d and 20a–d. The shift in the gate-to-source voltages causes these transistors to provide different charge and discharge currents to the capacitors Ca, Cb, and Cp, respectively. As stated above, changes to the charge and discharge currents cause changes in Dra, Drb, Dfa, and Dfb, and thus cause changes in Drt and Dft Furthermore, as $V_{DD}$ changes, so do the trip points of the stages 12a, 12b, 14, and 16. Thus, the combination of the changing gate-to-source voltages and the changing stage trip points often alters Drt and Dft of the circuit 10 significantly. Table 1 shows the delays Drt and Dft that one embodiment of the circuit 10 provides for $V_{DD}$ equal to 2.8V, 3.3V, and 4.0V. This embodiment of the circuit 10 is designed to provide D=Drt=Dft=3 nanoseconds (ns) for $V_{DD}$=3.3V.

TABLE 1

| $V_{DD}$ = 2.8 V (Drt/Dft) | $V_{DD}$ = 3.3 V (Drt/Dft) | $V_{DD}$ = 4.0 V (Drt/Dft) |
|---|---|---|
| 3.45 nanoseconds (ns)/3.7 ns | 3 ns/3 ns | 2.23 ns/2.2 ns |

As shown in Table 1, as $V_{DD}$ moves from 3.3V, Drt and Dft become unequal to D as well as unequal to each other.

SUMMARY OF THE INVENTION

In accordance with one aspect of the present invention, a delay circuit includes an input terminal that receives an input signal, an output terminal that provides an output signal that is a delayed version of the input signal, and a supply terminal that receives a supply voltage. A delay stage is coupled between the input and the output terminals and generates the output signal a predetermined delay time after it receives the input signal when the supply voltage has an expected value. A control stage is coupled between the supply terminal and the delay stage and regulates the supply current that flows between the supply terminal and the delay stage such that the delay time of the delay stage remains substantially constant as the supply voltage varies from the expected value. In a related aspect of the invention, the control stage maintains the supply current within a predetermined range as the supply voltage varies from the expected value. In another related aspect of the invention, the control stage includes a controllable current source that regulates the flow of current from the power supply to the delay stage. The control stage also includes a circuit for generating a current-source control signal that increases and decreases in magnitude as the supply voltage respectively increases and decreases in magnitude from the expected value.

In another aspect of the invention, the input terminal of the delay circuit receives an input signal that transitions from a first signal level to a second signal level, and that at some time later, transitions from the second signal level to the first signal level. The output terminal provides an output signal that has first and second transitions that are respectively delayed from the first and second transitions of the input signal. First and second supply terminals receive first and second supply voltages, respectively. A delay stage is coupled between the input and output terminals. The delay stage generates the first transition of the output signal at a first delay time after receiving the first transition of the input signal, the first delay time equal to a first predetermined time when the first and second supply voltages respectively equal first and second desired voltages, and generates the second transition of the output signal at a second delay time after receiving the second transition of the input signal, the second delay time equal to a second predetermined time when the first and second supply voltages respectively equal the first and second desired voltages. A first control stage is coupled between the first supply terminal and the delay stage, and regulates a first supply current that flows between the first supply terminal and the delay stage such that the first delay time remains substantially constant as the first supply voltage varies from the first desired voltage. The delay circuit also includes a second control stage that is coupled between the second supply terminal and the delay stage. The second control stage regulates a second supply current that flows between the second supply terminal and the delay stage such that the second delay time remains substantially constant as the first supply voltage varies from the first desired voltage.

An advantage provided by one aspect of the present invention is a delay time that remains substantially constant over a relatively wide range of power-supply voltages.

DETAILED DESCRIPTION OF THE INVENTION

Figure 2:
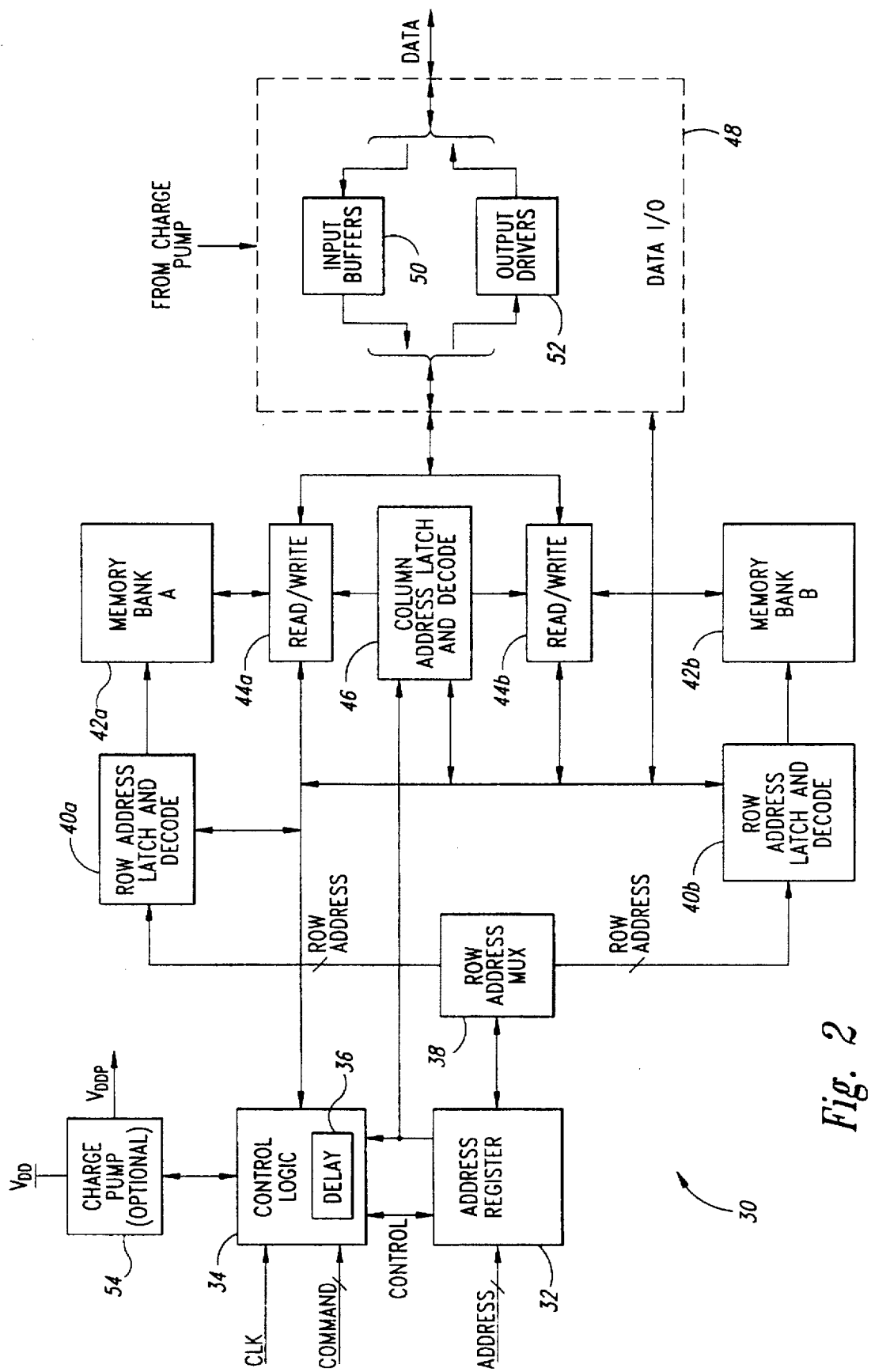
FIG. 2 is a block diagram of a memory device according to the present invention.

FIG. 2 is a block diagram of a memory device 30, which incorporates the present invention. In one aspect of the invention, the memory device 30 is a synchronous dynamic random access memory (SDRAM), although the present invention may be used in other types of memories, and in integrated circuits other than memories, such as microprocessors.

The memory device 30 includes an address register 32 that receives an address from an address bus ADDRESS. A control logic circuit 34 receives CLK and COMMAND signals, and communicates with the other elements of the memory device 30. The control logic 34 may also include a delay circuit 36, which, in accordance with the present invention, provides a substantially constant signal delay over a relatively wide range of power-supply voltages $V_{DD}$. Although not shown, it is understood that one or more of the circuit blocks other than the control logic 34 may include one or more delay circuits that are similar or identical to the delay circuit 36. The delay circuit 36 is further discussed below in conjunction with FIG. 3.

A row address multiplexer 38 receives the address signal from the address register 32, and provides the row address to the row address latch and decode circuits 40a and 40b. During read and write cycles, the row address latch and decode circuits 40a and 40b activate the word lines of the addressed rows of memory cells in the memory banks 42a and 42b, respectively. Read/write circuits 44a and 44b read data from the addressed memory cells in the memory banks 42a and 42b, respectively, during a read cycle, and write data to the addressed memory cells during a write cycle. A column address latch and decode circuit 46 receives the address from the address register 32 and provides the column address of the selected memory cells to the read/write circuits 44a and 44b. For clarity, the address register 38, the row address multiplexer 32, the row-address latch and decode circuits 34a and 34b, and the column-address latch and decode circuit 46 can be collectively referred to as the address decoder.

A data input/output (I/O) circuit 48 includes a plurality of input buffers 50. During a write cycle, the buffers 50 receive and store data from the DATA bus, and the read/write circuits 44a and 44b provide this stored data to the memory banks 42a and 42b. The data I/O circuit 48 also includes a plurality of output drivers 52. During a read cycle, the read/write circuits 44a and 44b provide data from the memory banks 42a and 42b to the drivers 52, which in turn provide this data to the DATA bus.

The memory device 30 may also include an optional charge pump 54 that steps up the power-supply voltage $V_{DD}$ to a voltage $V_{DDP}$. In one aspect of the invention, the pump 54 generates $V_{DDP}$ approximately 1–1.5V higher than $V_{DD}$. The memory device 30 may use $V_{DDP}$ to overdrive selected internal transistors in a conventional manner.

In operation, if the memory device 30 is an SDRAM, then all of the input signals and output signals, as well as many of the internal signals, are synchronized to the CLK signal. Thus, the relative timing of these signals must often meet stringent specifications, i.e., must be accurately controlled, in order that the SDRAM operate properly and at its rated speed. Typically, the memory device 30 uses one or more delay circuits 36 to control the relative timing of these signals. For example, a delay circuit 36 may delay one signal to compensate for a delay introduced to another signal, and thus accurately maintain a desired timing between the two signals. As stated above, unlike prior delay circuits, the delay circuits 36 are designed to provide substantially constant delays over a relatively wide range of $V_{DD}$. Thus, the delay circuits 36 allow the same memory device 30 to be used with a variety of popular supply voltages, such as 3.3V and 5.0V. Such a multi-voltage capability eliminates the need for designing and manufacturing different versions of the memory device 30 that operate at different supply voltages. Furthermore, the delay circuits 36 maintain the proper operation of the memory device 30 in systems where the supply voltage varies from an optimum value for reasons including a poorly regulated supply voltage or transients in the supply lines.

Figure 3:
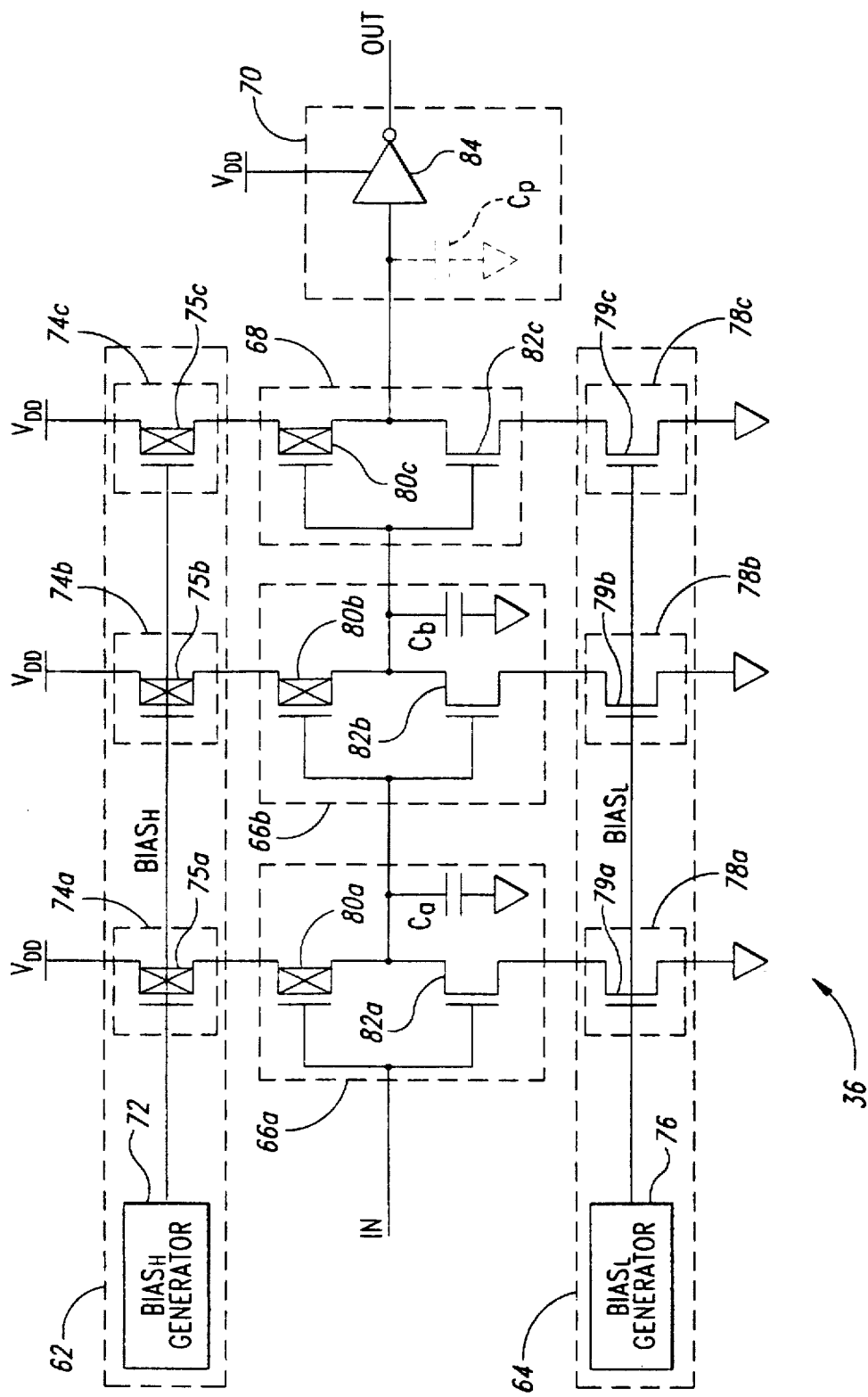
FIG. 3 is a schematic diagram of the delay circuit of FIG. 1 according to the present invention.

FIG. 3 is a schematic diagram of one embodiment of the delay circuit 36 of FIG. 2. The delay circuit 36 includes a first control or bias stage 62 and a second control or bias stage 64. The stages 62 and 64 regulate the currents that flow between the power-supply terminals, which are coupled to $V_{DD}$ and ground, and the primary delay stages 66a and 66b and an intermediate stage 68. By regulating the current flow between the supply terminals and the stages 66a, 66b, and 68, the delay circuit 36 provides a substantially constant delay time over a relatively wide range of $V_{DD}$. Although not shown, other embodiments of the delay circuit 36 may regulate the current that flows between the supply terminals and an output stage 70. Furthermore, other embodiments of the delay circuit 36 may include one or more than two delay stages 66, zero or multiple intermediate stages 68, and zero or multiple inverters 70.

The first control stage 62 includes a bias-high ($Bias_H$) generator 72, which provides a control signal to the current regulators or limiters 74a–c. The current regulators 74a–c preferably include PMOS transistors 75a–c, respectively, which operate as current sources and thus source current to the stages 66a, 66b, and 68, respectively. The $BiaS_H$ generator 72 is further discussed below in conjunction with FIG. 4. The second control stage 64 includes a bias-low ($Bias_L$) generator 76, which provides a control signal to the current regulators or limiters 78a–c. The current regulators 78a–c preferably include NMOS transistors 79a–c, respectively, which operate as current sources and thus sink current from the stages 66a, 66b, and 68, respectively.

The delay stage 66a includes a capacitor Ca, and includes a PMOS transistor 80a and an NMOS transistor 82a that are coupled in a conventional push-pull configuration. The delay stage 66b is constructed identically to the stage 66a. The intermediate stage 68 includes a PMOS transistor 80c and an NMOS transistor 82c, which are coupled in a push-pull configuration, but lacks the capacitor of the stages 66a and 66b. The output stage 70 includes a conventional inverter 84, which has associated therewith a parasitic capacitance Cp. Each of the stages 66a, 66b, and 68 has associated therewith a voltage switching threshold, i.e., trip point.

In operation, when $V_{DD}$ equals the desired voltage, i.e., the voltage at which the delay circuit 36 was designed to operate, each of the stages 66a, 66b, and 68 has a desired voltage trip point. With reference to the delay stage 66a, the trip point is the voltage value of the input signal that causes both the PMOS and NMOS transistors 80a and 82a to draw equal currents. As the input signal rises above the trip point toward logic 1, the NMOS transistor 82a sinks more current and the PMOS transistor 80a sources less current. Eventually, as the input signal continues to rise, the PMOS transistor 80a turns fully off, and the NMOS transistor 82a turns fully on and drives the output of the stage 66a to logic 0. Likewise, as the input signal falls below the trip point toward logic 0, the PMOS transistor 80a sources more current and the NMOS transistor 82a sinks less current. Eventually, as the input signal continues to fall, the NMOS transistor 82a turns fully off, and the PMOS transistor 80a turns fully one and drives the output to logic 1. The stages 66b and 68 operate in a similar manner.

During a transition of the input signal IN from logic 1 to logic 0, i.e., a falling edge of the signal IN, as IN reaches and falls below the trip point of the delay stage 66a, the NMOS transistor 82a turns off, and the PMOS transistor 80a turns on. Initially, the capacitor Ca has across it a voltage of approximately 0V, which is equivalent to logic 0. Thus, a charge current flows from the power supply that provides $V_{DD}$, through the transistors 75a and 80a, to the capacitor Ca. The $Bias_H$ generator 72 generates a control voltage at the gate of the transistor 75a such that the transistor 75a limits the charge current to a first predetermined value. The predetermined value of the charge current is selected such that it charges the capacitor Ca to the trip point of the following stage 66b in a desired time. This desired time, which is a function of the charge current and the capacitor Ca, is the delay that the stage 66a introduces to the falling edge of IN. That is, the delay from the time the falling edge of IN equals the trip point of the stage 66a to the time that the voltage across Ca equals the trip point of the stage 66b is the falling-edge delay Dfa of the stage 66a. After charging Ca to the trip point of the stage 66b, the charge current continues to flow until it charges Ca to approximately $V_{DD}$, which is the voltage equivalent of logic 1. Of course, as the voltage across Ca increases, at some point the charge current will begin to decrease exponentially from its maximum value, i.e., the first predetermined value, until it approaches zero as the voltage across Ca approaches $V_{DD}$.

During a transition of IN from logic 0 to logic 1, i.e., a rising edge of the signal IN, as IN reaches and rises above the trip point of the stage 66a, the PMOS transistor 80a turns off, and the NMOS transistor 82a turns on. Initially, the capacitor Ca has across it a voltage of approximately $V_{DD}$, which is equivalent to logic 1. Thus, a discharge current flows from the capacitor Ca, through the transistors 79a and 82a, to ground. The BiaSL generator 76 generates a control voltage at the gate of the transistor 79a such that the transistor 79a limits the discharge current to a second predetermined value. The predetermined value of the discharge current is selected such that it discharges the capacitor Ca to the trip point of the following stage 66b in a desired time. This desired time, which is a function of the discharge current and the capacitor Ca, is the delay that the stage 66a introduces to the rising edge of IN. That is, the delay from the time the rising edge of IN equals the trip point of the stage 66a to the time that the voltage across Ca equals the trip point of the stage 66b is the rising-edge delay Dra of the stage 66a. After discharging Ca to the trip point of the stage 66b, the discharge current continues to flow until it discharges Ca to approximately 0V.

It is preferred the falling-edge delay Dfa equal the rising-edge delay Dra. Because Ca is a constant value, one can design the control circuits 62 and 64 to provide the appropriate currents to obtain such a symmetrical delay. Where the trip point of the stage 66a equals $V_{DD}/2$, the charge and discharge currents are approximately equal. For reasons including process parameters and transistor characteristics, the trip point of the stage 66a may be unequal to $V_{DD}/2$. In such a situation, the charge and discharge currents must be different so that Dfa=Dra.

The delay stage 66b and the current-limit transistors 75b and 79b operate in a manner identical to that of the delay stage 66a and the transistors 75a and 79a. The intermediate stage 68 and the current-limit transistors 75c and 79c operate in a manner similar to that of the delay stage 66a and the transistors 75a and 79a, except that the stage 68 charges and discharges only the parasitic capacitance $C_p$, which is typically much smaller than the capacitors Ca and Cb. Thus, the delay of the stage 68 is much less than, and is often negligible with respect to, the delays of the stages 66a and 66b. After the transition of IN has propagated through the stages 66a, 66b, and 68, the inverter 84 of the output stage 70 inverts and provides the delayed transition of the signal OUT a delay time Drt or Dft after the rising or falling edge of IN, respectively. Like the stage 68, the delay of the stage 70 is much less than, and is often negligible with respect to, the delays of the stages 66a and 66b.

Because the delays of the stages 68 and 70 are much less than the delays of the stages 66a and 66b, the total rise and fall delays Drt and Dft of the circuit 36 are approximately equal to the sums of the rise and fall delays Dra and Drb and Dfa and Dfb of the stages 66a and 66b, respectively. Where the delay of the stage 68 is not negligible compared with the delay of the stages 66a and 66b, it is preferred that the delay circuit 36 include the current-limit transistors 75c and 79c to insure that the delay stage 68 introduces a substantially constant delay time as $V_{DD}$ varies from a desired value. The delay of the stage 68 is not negligible when the value of Cp is of the same order of magnitude as the values of Ca and Cb. In this circumstance, Drt≈Dra+Drb+Drp, and Dft≈Dfa+Dfb+Dfp, where Drp and Dfp are the rise and fall delays of the stage 68, respectively. Where the delay of the stage 68 is negligible, however, i.e., the value of Cp is much less than the values of Ca and Cb, the transistors 75c and 79c may be omitted.

Still referring to FIG. 3, in order to maintain the total rise and fall delays Drt and Dft substantially constant and equal over a relatively wide range of power-supply voltages, the control stages 62 and 64 adjust the charge and discharge currents of the stages 66a, 66b, and 68 to compensate for changes in $V_{DD}$. (It is assumed that the delay of the stage 70 is negligible as compared with those of the stages 66a and 66b. In this case, the currents to the stage 70 need not be adjusted.) As the magnitude of $V_{DD}$ increases or decreases from the preferred value, the trip points of the stages 66a, 66b, 68 and the currents provided by the transistors 75a–c and 79a–c will shift as well (assuming that the logic 1 level of IN is approximately equal to $V_{DD}$ and that the logic 0 level of IN is approximately equal to ground). For example, if $V_{DD}$ increases, then these trip points and currents increase too. If $V_{DD}$ decreases, then these trip points and currents decrease too. Conversely, if ground increases above 0V, then the trip points of the stages 66a, 66b, and 68 increase and the currents sunk by the transistors 79a–c decrease. If ground decreases below 0V, then these trip points decrease and these currents increase. Such shifts in the trip points and currents, without appropriate compensation, will shift the delays of the stages 66a, 66b, and 68, and thus will shift the total delays Drt and Dft of the circuit 36 away from each other, the desired value, or both.

Figure 1:
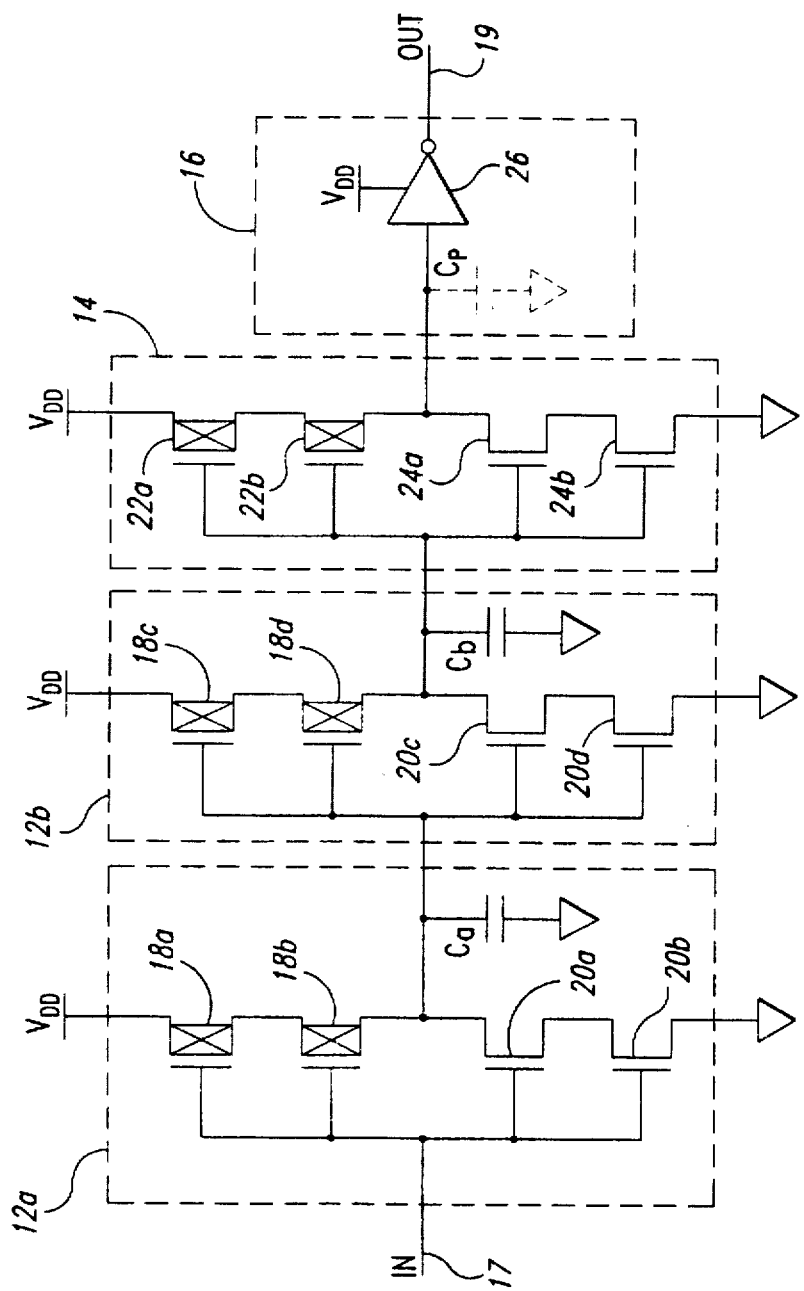
FIG. 1 is a schematic diagram of a known delay circuit.

To compensate for the shifts in the values of the currents provided by the transistors 75a–c and 79a–c to the stages 66a, 66b, and 68, respectively, the $Bias_H$ and $Bias_L$ generators 72 and 76 adjust their respective control voltages to regulate these currents. Generally, as $V_{DD}$ increases, the $Bias_H$ generator 72 increases the control voltage to the transistors 75a–c to limit the charge currents to the stages 66a, 66b, and 68 to substantially constant levels, or to slow the increase of these currents relative to known delay circuits such as the circuit 10 of FIG. 1.

For relatively small shifts in $V_{DD}$ (where shifts in the trip points of the stages 66a, 66b, and 68 are relatively small), the $Bias_H$ generator 72 may generate the control voltage so as to keep the gate-to-source voltages of the transistors 75a–c at a substantially constant level, and thus limit the maximum charge currents supplied by the transistors 75a–c to substantially constant levels. Because the charge current remains substantially constant, and because the capacitance of Ca remains constant, the charge time of Ca also remains substantially constant.

For relatively large shifts in $V_{DD}$ (where shifts in the trip points of the stages 66a, 66b, and 68 are relatively large), the $Bias_H$ generator 72 may generate the control voltage not only to compensate for the shift in $V_{DD}$, but also to compensate for the shift in the trip points of the stages 66a, 66b, and 68. For example, as $V_{DD}$ increases, so does the trip point of the stage 66a. Thus, the charge current must charge Ca to a higher voltage level before the voltage across Ca reaches the trip point of the following stage 66b. The $Bias_H$ generator 72 may generate the control voltage to increase the gate-to-source voltage of the transistor 75a as $V_{DD}$ increases, so that the transistor 75a provides a slightly greater charge current that charges the capacitor Ca to the increased trip voltage of the stage 66b in the desired delay time Dfa.

For both relatively small and relatively large shifts in $V_{DD}$ as described above, the actual values of the currents provided by the transistors 75a–c, and thus the actual values of the control voltage provided by the $Bias_H$ generator 62, depend not only upon the sizes of the capacitors Ca, Cb, and $C_p$ and the value of $V_{DD}$, but also upon the dimensions and other characteristics of the transistors that form the stages 66a, 66b, and 68. Furthermore, in other embodiments of the invention, a $Bias_H$ generator 72 may be included for each of the transistors 75a–c to allow individual control of the currents provided by these transistors.

The $Bias_L$ generator 76 operates similarly to the $Bias_H$ generator 72 to compensate for shifts in the ground voltage. In one embodiment of the invention, the ground voltage is relatively stable, and thus the $Bias_L$ generator 76 provides a substantially constant control voltage that does not change. Such a $Bias_L$ generator 76 is particularly suited for applications where $V_{DD}$ does not change more than a few volts from the preferred voltage.

Table 2 shows Drt and Dft over a range of $V_{DD}$ for an embodiment of the delay circuit 60 that includes a $Bias_L$ generator 76 that generates a fixed voltage of 1.4V. In this embodiment of the delay circuit 60, the channel widths of all the transistors are 1 micron (μm). The channel lengths of the PMOS transistors 75a–c and 80a–c are 15 μm, and the channel lengths of the NMOS transistors 79a–c and 82a–c are 10 μm.

TABLE 2

|  | $V_{DD}$ = 2.8 V | $V_{DD}$ = 3.30 V | $V_{DD}$ = 4.0 V |
|---|---|---|---|
| $Bias_L$ | 1.4 V | 1.4 V | 1.4 V |
| $Bias_H$ | 1.15 V | 1.4 V | 2.1 V |
| Drt/Dft | 2.9 ns/3.05 ns | 3 ns/3 ns | 2.98 ns/3.05 ns |

As shown in Table 1, for a range of $V_{DD}$ from 2.8 to 4.0 V, the maximum change in Drt from its desired value is 0.1 ns, and the maximum change in Dft from its desired value is 0.05 ns.

Although FIG. 3 shows a preferred embodiment of the delay circuit 60, various modifications may be made thereto. For example, the current regulators 74a–c and 78a–c may include multiple PMOS transistors connected in series. Furthermore, the stages 66a, 66b, and 68 may contain multiple PMOS transistors or NMOS transistors connected in series.

Figure 4:
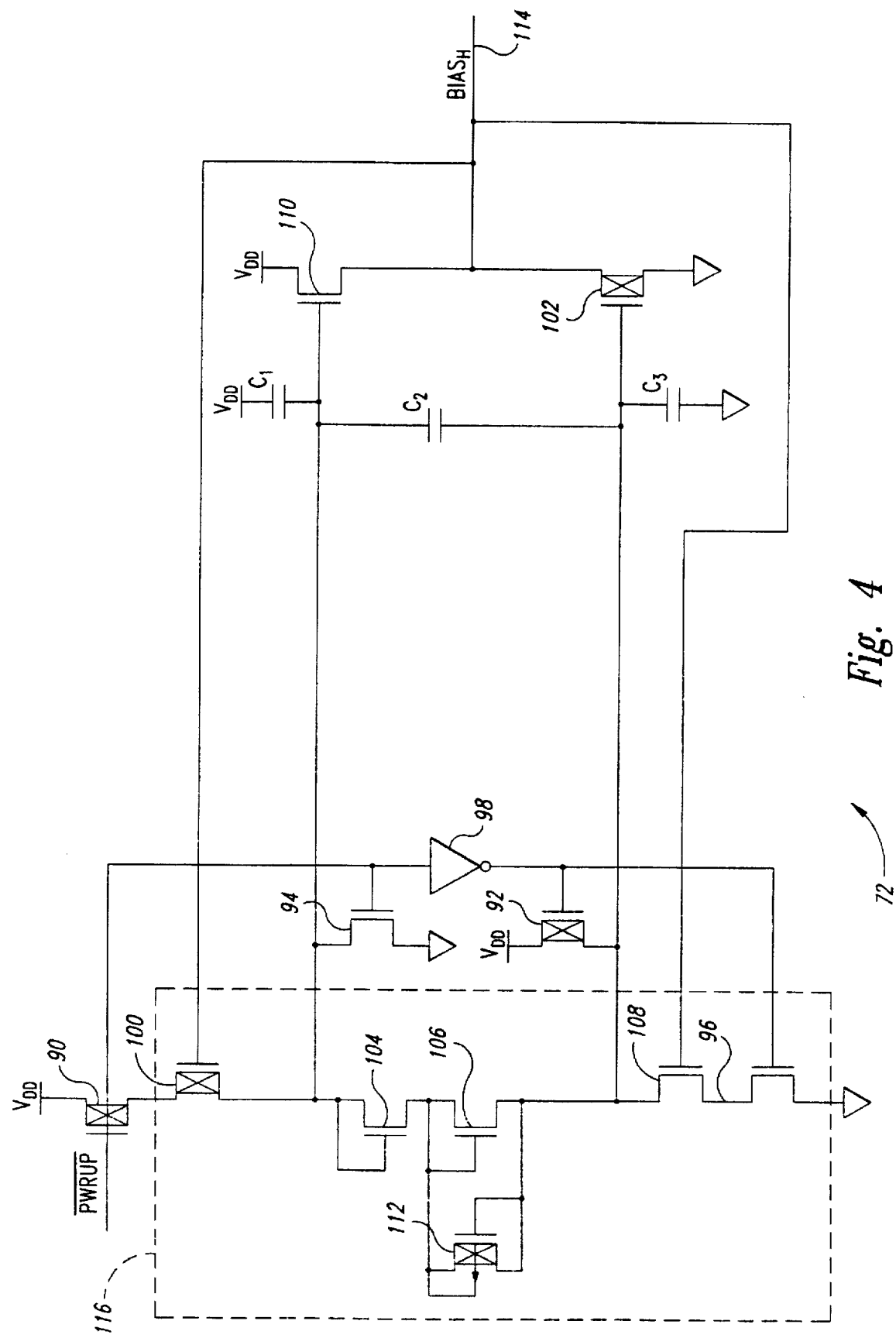
FIG. 4 is a schematic diagram of the bias-high generator circuit of FIG. 3.

FIG. 4 is a schematic diagram of one embodiment of the $Bias_H$ generator 72 of FIG. 3. In addition to the circuitry that generates the control voltage, the generator 72 includes a power-up circuit that receives a signal $\overline{PWRUP}$ and disables the generator 72 until $V_{DD}$ reaches a desired value and is stable. The power-up circuit includes PMOS transistors 90 and 92, NMOS transistors 94 and 96, and inverter 98. The control-voltage generator circuit includes PMOS transistors 100 and 102, and NMOS transistors 104, 106, 108 and 110. The control-voltage generator circuit may also include an optional PMOS transistor 112 and capacitors $C_1$–$C_3$. The transistors 100, 104, 106, 108, and, when included, 112, form a voltage-divider network 116.

In operation, when $\overline{PWRUP}$ is inactive logic 1 to indicate that $V_{DD}$ is at an inadequate level to provide power, the transistor 90 turns off to prevent current from flowing between the divider network 116 and $V_{DD}$. The inverter 98 generates logic 0 to turn off the transistor 96, which prevents current from flowing between the divider network 116 and ground. The logic 1 $\overline{PWRUP}$ signal also turns on the transistor 94, which pulls the gate of the transistor 110 to ground, thus turning it off. Likewise, the logic 0 provided by the inverter 98 turns on the transistor 92, which drives the gate of the transistor 102 to $V_{DD}$, thus turning it off. Thus, the output 114 of the generator circuit 72 is not driven with any signal, and is thus left floating or in a tristate condition.

When the signal $\overline{PWRUP}$ is inactive logic 0, then the transistors 90 and 96 are on, and thus allow a current to flow between $V_{DD}$ and ground via the divider network 116. Likewise, the transistors 92 and 94 are off, and thus allow the divider network 116 to control the voltages at the gates of the transistors 110 and 102. The divider network 116 generates first and second voltages, respectively, at the gates of the transistors 110 and 102. Specifically, transistors 104 and 106 are each connected in a diode configuration, and act as active loads to maintain a two-threshold voltage drop between the gates of transistors 110 and 102. Thus, the transistors 104 and 106 generate the first and second voltages such that both of the transistors 110 and 102 are always in a conducting state. When present, the optional transistor 112 is typically used to adjust or "tweak" the values of the first and second voltages.

The transistor 110 sources a current to the output terminal 114. Because no current flows from or into the generator 72 via the output terminal 114, the transistor 102 must sink a current equal to that sourced by the transistor 110. As $V_{DD}$ increases, the first and second voltages at the gates of the transistors 110 and 102 also increase. Thus, to maintain equal currents through the transistors 110 and 102, as the voltage at the gates of these transistors increases, the $Bias_H$ control voltage at the terminal 114 must also increase so that the gate-to-source voltages of the transistors 110 and 102 adjust accordingly. Similarly, as $V_{DD}$ decreases, then the $Bias_H$ control voltage also decreases.

The $Bias_H$ control voltage is fed back to the gates of the transistors 100 and 108 to form a negative feedback loop. The negative feedback that this loop provides controls the gain and other characteristics of the divider network 116 such that the generator 72 provides the desired $Bias_H$ control voltage. Furthermore, the capacitors $C_1$, $C_2$, and $C_3$ are typically included to stabilize the negative feedback loop, and thus to prevent undesired oscillations that an unstable feedback loop may cause.

For one embodiment of the $Bias_H$ generator 72, the width-to-length ratios of the transistors are as follows: transistors 90 and 96, 10/2, transistor 100, 10/24, transistors 104 and 106, 20/1.5, transistors 92 and 94, 10/1.5, transistor 102, 600/2, transistor 110, 300/2, and transistor 112, 30/1.5. This embodiment of the generator 72 provides the $Bias_H$ control voltage values listed in Table 2.

Figure 5:
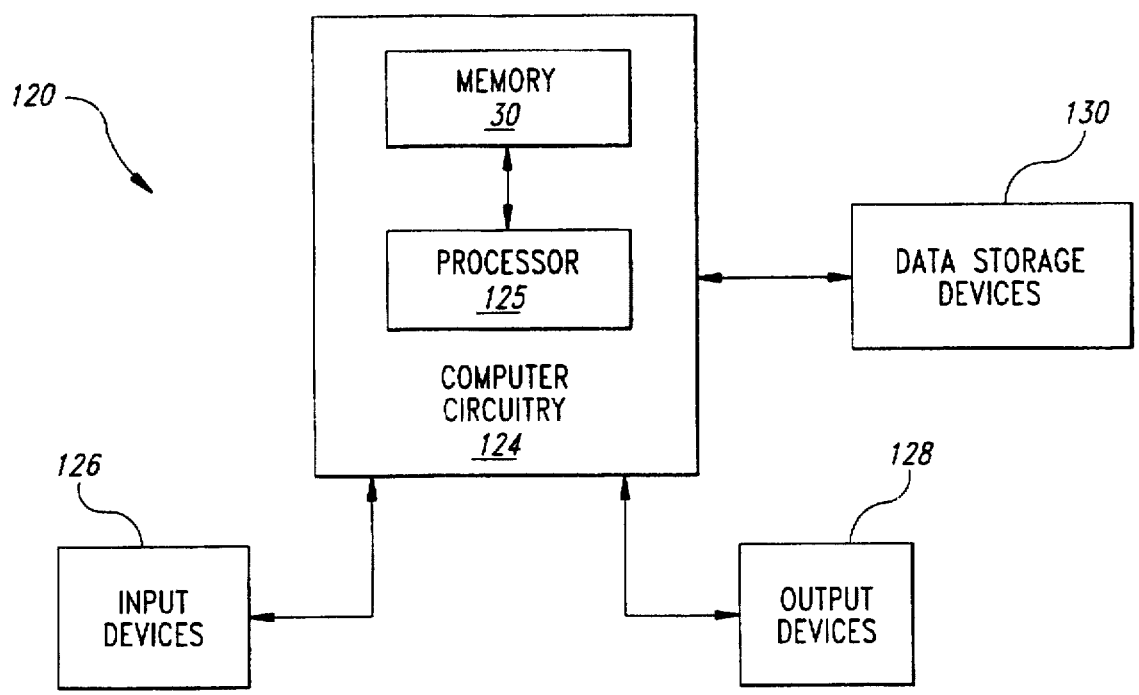
FIG. 5 is a block diagram of a computer system according to the present invention.

FIG. 5 is a block diagram of a computer system 120, which incorporates the memory device 30 of FIG. 2. The computer system 120 includes computer circuitry 124 for performing computer functions, such as executing software to perform desired calculations and tasks. The circuitry 124 typically includes a processor 125 and the memory device 30, which is coupled to the processor 125. One or more input devices 126, such as a keypad or a mouse, are coupled to the computer circuitry 124 and allow an operator (not shown) to manually input data thereto. One or more output devices 128 are coupled to the computer circuitry 124 to provide to the operator data generated by the computer circuitry 124. Examples of such output devices 128 include a printer and a video display unit. One or more data-storage devices 130 are coupled to the computer circuitry 124 to store data on or retrieve data from external storage media (not shown). Examples of the storage devices 130 and the corresponding storage media include drives that accept hard and floppy disks, tape cassettes, and compact disk read-only memories (CD-ROMs). Typically, the computer circuitry 124 includes address, data, and command buses and a clock line that are respectively coupled to the ADDRESS, DATA, and COMMAND buses and the CLK line of the memory device 30.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A circuit, comprising:

an input terminal operable to receive an input signal;

an output terminal operable to provide an output signal;

a supply terminal operable to receive a supply voltage;

a delay stage coupled between said input and output terminals, said delay stage operable to generate said output signal on said output terminal a predetermined delay time after receiving said input signal on said input terminal when said supply voltage has a predetermined value; and a control stage coupled between said supply terminal and said delay stage, said control stage operable to regulate a supply current between said supply terminal and said delay stage such that the delay time of said delay stage remains substantially equal to said predetermined delay time as said supply voltage varies from said predetermined value.

2. The circuit of claim 1 wherein said control stage comprises:

a controllable current source coupled between said supply terminal and said delay stage, said current source operable to generate said supply current; and a generator coupled to said current source and to said supply terminal, said generator operable to generate a control signal that causes said current source to substantially maintain said supply current within a predetermined range as said supply voltage varies from said predetermined value.

3. The circuit of claim 1 wherein said control stage comprises:

a controllable current source coupled between said supply terminal and said delay stage, said current source operable to generate said supply current; and a generator coupled to said current source and to said supply terminal, said generator operable to control said current source by generating a control signal that increases and decreases in magnitude as said supply voltage respectively increases and decreases in magnitude from said predetermined value.

4. A delay circuit, comprising:

an input terminal operable to receive an input signal that includes a first transition from a first signal level to a second signal level and that includes a second transition from said second signal level to said first signal level;

an output terminal operable to provide an output signal that includes a first transition from a third signal level to a fourth signal level and that includes a second transition from said fourth signal level to said third signal level;

first and second supply terminals operable to receive first and second supply voltages respectively;

a delay stage coupled between said input and output terminals, said delay stage operable to generate said first transition of output signal a first delay time after receiving said first transition of said input signal, said first delay time equal to a first predetermined delay time when said first and second supply voltages respectively equal first and second predetermined voltages, said delay stage operable to generate said second transition of said output signal a second delay time after receiving said second transition of said input signal, said second delay time equal to a second predetermined delay time when said first and second supply voltages respectively equal said first and second predetermined voltages;

a first control stage coupled between said first supply terminal and said delay stage, said first control stage operable to regulate a first supply current between said first supply terminal and said delay stage such that said first delay time remains substantially constant as said first supply voltage varies from said first predetermined voltage; and a second control stage coupled between said second supply terminal and said delay stage, said second control stage operable to regulate a second supply current between said second supply terminal and said delay stage such that said second delay time remains substantially constant as said first supply voltage varies from said first predetermined voltage.

5. The delay circuit of claim 4 wherein:

said first control stage comprises,
a first current source coupled between said first supply terminal and said delay stage, said first current source operable to generate said first supply current, and
a first generator coupled to said first current source and to said first supply terminal, said generator operable to generate a first control signal that causes said current source to substantially limit said first supply current to a first predetermined current; and said second control stage comprises,
a second current source coupled between said second supply terminal and said delay stage, said second current source operable to generate said second supply current, and
a second generator coupled to said second current source, said second generator operable to generate a second control signal that causes said second current source to substantially limit said second supply current to a second predetermined current.

6. The delay circuit of claim 4 wherein said first control stage comprises:

a voltage-controlled current source coupled between said first supply terminal and said delay stage, said current source operable to generate said first supply current; and a generator coupled to said current source and to said first supply terminal, said generator operable to control said current source by generating a control voltage that increases and decreases in magnitude as said first supply voltage respectively increases and decreases in magnitude from said first predetermined voltage.

7. The delay circuit of claim 4 wherein:

said first control stage comprises,
a first current source coupled between said first supply terminal and said delay stage, said current source operable to generate said first supply current, and
a first generator coupled to said current source and to said first supply terminal, said generator operable to control said current source by generating a control signal that increases and decreases in magnitude as said first supply voltage respectively increases and decreases in magnitude from said first predetermined voltage; and said second control stage comprises,
a second current source coupled between said second supply terminal and said delay stage, said second current source operable to generate said second supply current and to substantially limit said second supply current to a predetermined value.

8. The delay circuit of claim 4 wherein:

said first control stage comprises,
a first controllable current source coupled between said first supply terminal and said delay stage, said first current source operable to generate said first supply current, and a first generator coupled to said first current source and to said first supply terminal, said generator operable to generate a first control signal that causes said current source to substantially limit said first supply current to a first predetermined current; and said second control stage comprises,
a second controllable current source coupled between said second supply terminal and said delay stage, said second current source operable to generate said second supply current, and
a second generator coupled to said second current source, said second generator operable to generate a second control signal that has a substantially fixed magnitude and that causes said second current source to substantially limit said second supply current to a second predetermined current.

9. The delay circuit of claim 4 wherein:

said first control stage comprises,
a first voltage-controlled current source coupled between said first supply terminal and said delay stage, said current source operable to generate said first supply current, and
a first generator coupled to said current source and to said first supply terminal, said generator operable to control said current source by generating a first control voltage that increases and decreases in magnitude as said first supply voltage respectively increases and decreases in magnitude from said first predetermined voltage; and said second control stage comprises,
a second voltage-controlled current source coupled between said second supply terminal and said delay stage, said second current source operable to generate said second supply current, and
a second generator coupled to said second current source, said second generator operable to control said second current source by generating a second control voltage that has a substantially constant magnitude.

10. A circuit, comprising:

an input terminal;
an output terminal;
first and second power terminals;
a delay stage having an input coupled to said input terminal, an output coupled to said output terminal, a charge-current input, and a discharge-current input coupled to said second power terminal, said delay stage having a capacitance that can be alternately coupled to said charge-current and discharge-current inputs;
a charge-current generator having a control terminal, a charge current input terminal coupled to said first power terminal, and a charge-current output terminal coupled to said charge-current input of said delay stage; and
a charge-current regulator having a power input coupled to said first power terminal and having a charge-current control output coupled to said control terminal of said charge-current generator.

11. The circuit of claim 10, further comprising:

a discharge-current generator coupled between said delay stage and said second power terminal, said discharge-current generator having a control terminal, a discharge-current output terminal coupled to said discharge-current input of said delay stage, and a discharge-current input terminal coupled to said second power terminal; and a discharge-current regulator having a discharge-current control output coupled to said control terminal of said discharge current generator.

12. A circuit, comprising:

an input terminal;
an output terminal;
first and second power terminals;
a delay stage having an input coupled to said input terminal, and output coupled to said output terminal, a first current input, and a second current input coupled to said second power terminal;
a first current limiter having a current control terminal, a current input terminal coupled to said first power terminal, and a current output terminal coupled to said first current input of said delay stage;
a first current-limiter controller having a power input coupled to said first power terminal and having a current-limiter control output coupled to said current control terminal of said first current limiter;
a second current limiter having a current control terminal, a current output terminal coupled to said second current input of said delay stage, and a current input terminal coupled to said second power terminal; and
a second current-limiter controller having a current-limiter control output coupled to said current control terminal of said second current limiter.

13. The circuit of claim 12 wherein said delay stage comprises:

a first transistor having a first path terminal coupled to said first current input of said delay stage, a second path terminal coupled to said output of said delay stage, and a control terminal coupled to said input of said delay stage;
a second transistor having a first path terminal coupled to said output of said delay stage, a second path terminal coupled to said second current input of said delay stage, and a control terminal coupled to said input of said delay stage; and
a capacitor coupled between said output of said delay stage and said second power terminal.

14. The circuit of claim 12 wherein said first and second current limiters each comprise a transistor having a first path terminal coupled to said current input terminal, a second path terminal coupled to said current output terminal, and a control terminal coupled to said current control terminal.

15. The circuit of claim 12 wherein said second current-limiter controller comprises a fixed-voltage generator that is coupled to said output of said second current-limiter controller.

16. The circuit of claim 12 wherein said first current-limiter controller comprises:

a first transistor having a first path terminal coupled to said power input, a second path terminal, and a control terminal coupled to said current-limiter control output of said first controller;
a second transistor having both a first path terminal and a control terminal coupled to said second path terminal of said first transistor and having a second path terminal;
a third transistor having both a first path terminal and a control terminal coupled to said second path terminal of said second transistor and having a second path terminal;
a fourth transistor having a first path terminal coupled to said second path terminal of said third transistor, a control terminal coupled to said current-limiter control output of said first controller, and a second path terminal coupled to said second power terminal;

a fifth transistor having a first path terminal coupled to said power input of said first controller, a control terminal coupled to said first path terminal of said second transistor, and a second path terminal coupled to said current-limiter control output of said first current-limiter controller; and a sixth transistor having a first path terminal coupled to said current-limiter control output of said first controller, a control terminal coupled to said second path terminal of said third transistor, and a second path terminal coupled to said second power terminal.

17. The circuit of claim 16 wherein said first current-limiter controller further comprises a seventh transistor having a first path terminal coupled to said first path terminal of said third transistor and having both a second path terminal and a control terminal coupled to said second path terminal of said third transistor.

18. The circuit of claim 16 wherein said first current-limiter controller further comprises:

a first capacitor coupled between said power input of said first current-limiter controller and said control terminal of said fifth transistor;

a second capacitor coupled between said control terminals of said fifth and sixth transistors; and a third capacitor coupled between said control terminal of said sixth transistor and said second power terminal.

19. The circuit of claim 16 wherein said first and sixth transistors comprise PMOS transistors, and wherein said second, third, fourth, and fifth transistors comprise NMOS transistors.

20. A memory device, comprising:

first and second supply terminals;

address, data, and command busses;

a bank of memory cells;

an address decoder coupled to said address bus and said memory bank;

a control circuit coupled to said command bus and to said address decoder;

a read/write circuit coupled to said address decoder, control circuit, and memory bank;

a data input/output circuit coupled to said data bus, read/write circuit, and control circuit; and one of said address decoder, control circuit, read/write circuit, and data input/output circuit including a delay circuit that includes, an input terminal operable to receive a signal, an output terminal operable to provide a delayed version of said signal, a delay stage having an input coupled to said input terminal, an output coupled to said output terminal, a charge-current input, and a discharge-current input coupled to said second supply terminal, said delay stage having a capacitance that can be alternately coupled to said charge-current and discharge-current inputs, a charge-current generator having a control terminal, a charge-current input terminal coupled to said first supply terminal, and a charge-current output terminal coupled to said charge-current input of said delay stage, and a charge-current regulator having a power input coupled to said first supply terminal and having a charge-current control output coupled to said control terminal of said charge-current generator.

21. The memory device of claim 20 wherein said delay circuit further comprises:

a discharge-current generator coupled between said delay stage and said second supply terminal, said discharge current generator having a control terminal, a discharge-current output terminal coupled to said discharge-current input of said delay stage, and a discharge-current input terminal coupled to said second supply terminal; and a discharge-current regulator having a discharge-current control output coupled to said control terminal of said discharge-current generator.

22. A computer system, comprising:

a data input device;

a data output device; and computing circuitry coupled to said data input and output devices, said computing circuitry including a memory device that includes, first and second supply terminals, address, data, and command busses, a bank of memory cells, an address decoder coupled to said address bus and said memory bank, a control circuit coupled to said command bus and to said address decoder, a read/write circuit coupled to said address decoder, control circuit, and memory bank, a data input/output circuit coupled to said data bus, read/write circuit, and control circuit, and one of said address decoder, control circuit, read/write circuit, and data input/output circuit including a delay circuit that includes, an input terminal operable to receive a signal, an output terminal operable to provide a delayed version of said signal, a delay stage having an input coupled to said input terminal, an output coupled to said output terminal, a charge-current input, and a discharge-current input coupled to said second supply terminal, said delay stage having a capacitance that can be alternately coupled to said charge-current and discharge-current inputs, a charge-current generator having a control terminal, a charge current input terminal coupled to said first supply terminal, and a charge-current output terminal coupled to said charge-current input of said delay stage, and a charge-current regulator having a power input coupled to said first supply terminal and having a charge-current control output coupled to said control terminal of said charge-current generator.

23. The memory device of claim 22 wherein said delay circuit further comprises:

a discharge-current generator coupled between said delay stage and said second supply terminal, said discharge-current generator having a control terminal, a discharge-current output terminal coupled to said discharge-current input of said delay stage, and a discharge-current input terminal coupled to said second supply terminal; and a discharge-current regulator having a discharge-current control output coupled to said control terminal of said discharge-current generator.

* * * * *

UNITED STATES PATENT AND TRADEMARK OFFICE
CERTIFICATE OF CORRECTION

PATENT NO. : 5,748,542
DATED : May 5, 1998
INVENTOR(S) : Zheng et al.

It is certified that error appears in the above-identified patent and that said Letters Patent is hereby corrected as shown below:

Column 6, line 66        reads, "BiasL" should read - - $Bias_L$ - -

Signed and Sealed this

Seventeenth Day of April, 2001

Attest:

NICHOLAS P. GODICI

*Attesting Officer*      *Acting Director of the United States Patent and Trademark Office*